United States Patent

Nishibayashi et al.

Patent Number: 5,344,526
Date of Patent: Sep. 6, 1994

[54] METHOD FOR ETCHING DIAMOND

[75] Inventors: Yoshiki Nishibayashi; Shinichi Shikata, both of Itami, Japan

[73] Assignee: Sumitomo Electric Industries, Ltd., Osaka, Japan

[21] Appl. No.: 123,061

[22] Filed: Sep. 16, 1993

[51] Int. Cl.$^5$ .................. H01L 21/306; B44C 1/22
[52] U.S. Cl. .................. 156/643; 156/646; 156/659.1; 156/662; 252/79.1
[58] Field of Search .......... 156/643, 646, 659.1, 156/662, 345, DIG. 68; 252/79.1; 423/446

[56] References Cited

U.S. PATENT DOCUMENTS 5,006,203  4/1991  Purdes ..................... 156/646
5,102,498  4/1992  Itoh et al. ................ 156/659.1
5,250,149  10/1993 Kimoto et al. ............ 156/DIG. 68

FOREIGN PATENT DOCUMENTS 63-220524  9/1988  Japan.
63-220525  9/1988  Japan.

*Primary Examiner*—William Powell
*Attorney, Agent, or Firm*—Cushman, Darby & Cushman

[57] ABSTRACT

A diamond surface is selectively etched by forming a mask on a surface of diamond, and etching the diamond surface with a mixture of oxygen-containing gas and an inert gas, in which a concentration of oxygen in terms of $O_2$ is from 0.01 to 20% based on the whole volume of the mixture.

6 Claims, 2 Drawing Sheets

METHOD FOR ETCHING DIAMOND

BACKGROUND OF THE INVENTION

1. Field of the Invention

The present invention relates to a method for dry etching a surface of diamond which is used in the production of semiconductor devices.

2. Description of the Related Art

A diamond semiconductor device attracts attention since is functions stably under severe conditions such as high temperature or under irradiation, and can function at a high output. A reason for that the diamond device functions at high temperature may be that the band gap of diamond is as large as 5.5 eV, which may be attributed to the fact that a temperature at which carriers of the semiconductor cannot be controlled is higher than 1400° C.

When a device comprising diamond is produced, an etching technique is necessary in addition to epitaxy growth of diamond, electrode formation and wiring techniques. With silicon which is most widely used in electronic devices, the etching technique is well developed, and very complicated devices have been produced. It can be said that the etching technique makes it possible to produce the high performance electronic devices.

It is known that diamond can be etched with oxygen (see, for example, Japanese Patent Kokai Publication No. 220524/1988).

When diamond is etched with oxygen, etch pits tend to be formed or unevenness appears on the surface of diamond. Therefore, the etched surface of diamond cannot be smooth enough for the production of electronic devices.

When the surface of diamond is etched with argon, the diamond surface can be smoothly etched, but a masking material is also etched. That is, the diamond surface is not etched with sufficient selection between the diamond and the masking material. Therefore, argon cannot be used for etching diamond in the production of electronic devices.

Further, Japanese Patent Kokai Publication No. 220525/1988 discloses the use of a mixture of oxygen and argon for etching diamond. But, this Kokai Publication describes that, when a mixture of oxygen and argon in a ratio of 1:1 was used, the etched diamond surface was rough.

None of the above prior arts is succeeded in etching the diamond surface selectively when it is masked.

SUMMARY OF THE INVENTION

An object of the present invention is to provide a method for selectively etching a surface of diamond using masking to form a smooth diamond surface.

According to the present invention, there is provided a method for etching a diamond surface comprising steps of forming a mask on a surface of diamond, and etching the diamond surface with a mixture of oxygen-containing gas and an inert gas, wherein a concentration of oxygen in terms of $O_2$ is from 0.01 to 20% based on the whole volume of the mixture.

DETAILED DESCRIPTION OF THE INVENTION

Figure 1:
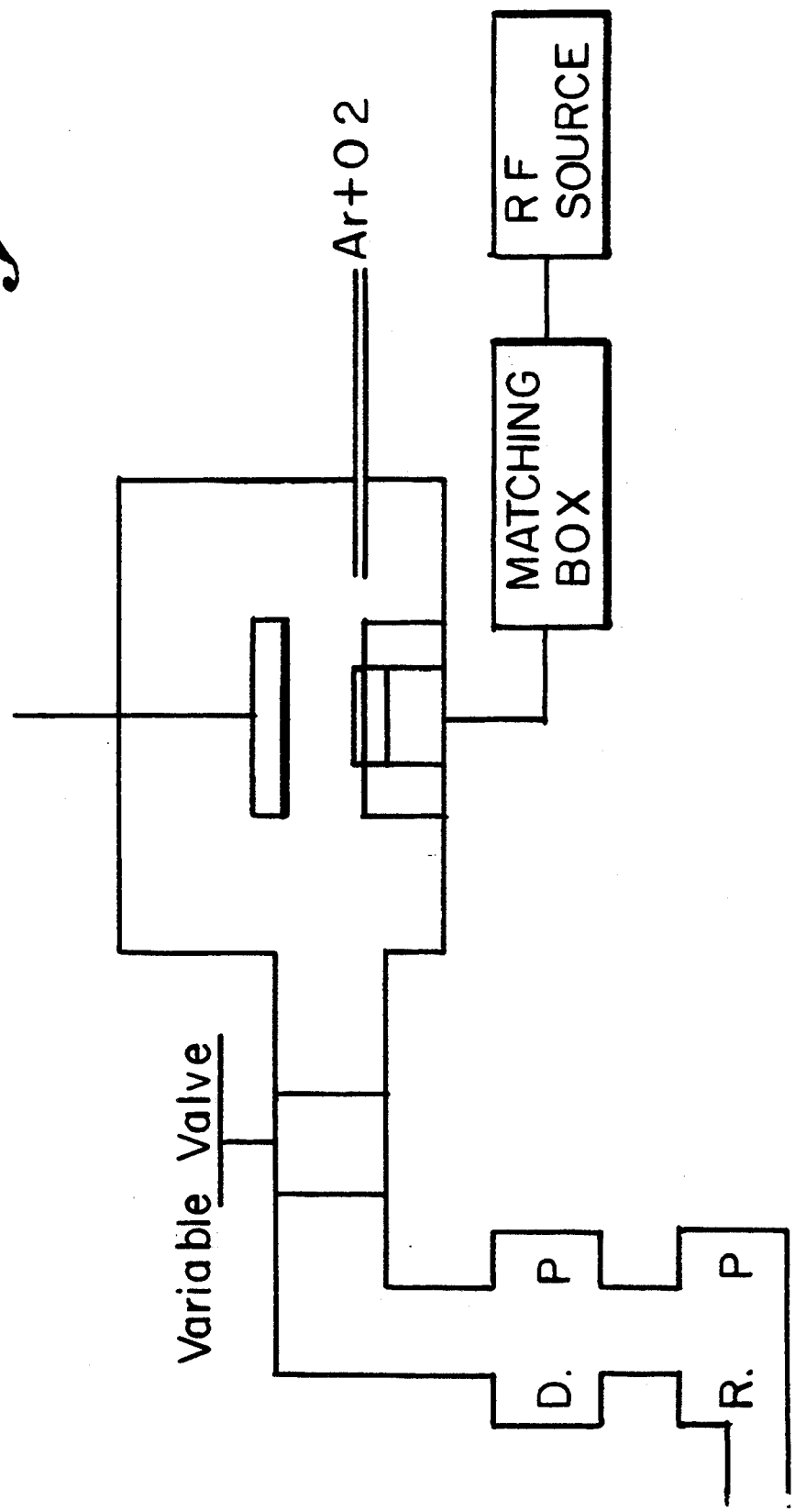
FIG. 1 schematically shows an example of a plasma etching apparatus for carrying out the etching method according to the present invention.

When the diamond surface is etched with the argon gas, the etched surface is smooth. However, since the etching selectivity between the diamond surface and the masking material is small, the diamond surface cannot be selectively etched with argon practically.

When the oxygen gas ($O_2$) is used, an etching rate of diamond is high, while an etching rate of a material which forms a stable oxide through a reaction with oxygen is low. Therefore, if such material is used as a masking material, the etching selectivity of the diamond surface is increased to, for example, 5. However, when the diamond surface is etched with the oxygen gas, the etched surface is not smooth.

The above phenomena may be understood as follows:

Since argon is one of the inert gases, its molecules hit a material to be etched to impart energy to atoms of the material and remove the atoms from the material, whereby the material is etched. Therefore, the etching mechanism does not depend on chemical properties of the material to be etched so much. On the other hand, the oxygen gas impart the energy to the material to be etched, and further, oxygen atoms generated by decomposition of the oxygen molecules react with the material to be etched, whereby the material is physically and chemically etched.

When a material which forms a stable oxide through a reaction with the oxygen is plasma etched with the oxygen gas, a stable film of the oxide is formed on the surface of the material, so that the material is not etched. For example, when aluminum is etched in the plasma, a hard $Al_2O_3$ film is formed on the surface of alumina. When $SiO_2$ is exposed to the oxygen plasma, no oxidation proceeds. In contrast, when diamond is oxidized, carbon dioxide is formed, and liberates from the diamond surface. Therefore, the diamond surface is etched with the oxygen ($O_2$) plasma.

When the mixture of argon and oxygen is used in etching, the physical etching will be predominant at the high concentration of argon, while the chemical etching will be predominant at the high concentration of oxygen ($O_2$).

In view of the above consideration, according to the present invention, the mixing ratio of argon and oxygen is suitably selected depending on the kind of the masking material to etch the masked diamond surface at the high etching selectivity and obtain the smoothly etched diamond surface.

According to the present invention, a concentration of the oxygen-containing gas in the mixture is from 0.01 to 20% in terms of $O_2$ based on the whole volume of the mixture.

For example, when aluminum is used as a masking material, the oxygen concentration is from 0.1 to 20%, preferably from 0.3 to 20%. When $SiO_2$ is used as a making material, the oxygen concentration is from 0.06 to 20%, preferably from 0.2 to 6%. With other masking materials, the concentration of oxygen gas in the mixture can be easily determined by simple experiments.

In addition to argon, any other inert gas such as He, Ne, Kr, Xe and the like may be used.

Preferred examples of the oxygen-containing gas are oxygen gas (O$_2$), CO$_2$, CO, N$_2$O, H$_2$O, and the like, though other oxygen-containing gas may be used.

The etching conditions other than the composition of the mixture of the inert gas and oxygen can be the same as those in the conventional etching of diamond with the oxygen gas or the inert gas.

For example, a pressure is from 0.001 to 0.5 Torr, and a power is from 10 to 700 W.

PREFERRED EMBODIMENTS OF THE INVENTION

EXAMPLE 1

On a single crystal diamond synthesized by the extra high pressure method having the (100) plane, the (110) plane or the (111) plane on the exposed surface, a SiO$_2$ film or an aluminum film was formed. On the formed film, a masking pattern having a line width of 2 μm was drawn by photolithography.

The diamond substrate having the masking pattern was plasma etched with the mixture of argon and O$_2$ at the total pressure was 0.02 Torr (2.7 Pa) by the RF output of 100 W for 30 minutes. By changing the oxygen content in the mixture of argon and O2 from 0.01% to 50%, the etching selectivity of diamond was measured.

The etching selectivity of diamond is a ratio of an etching rate (an etched thickness per unit time) of diamond to that of the masking material.

Figure 2:
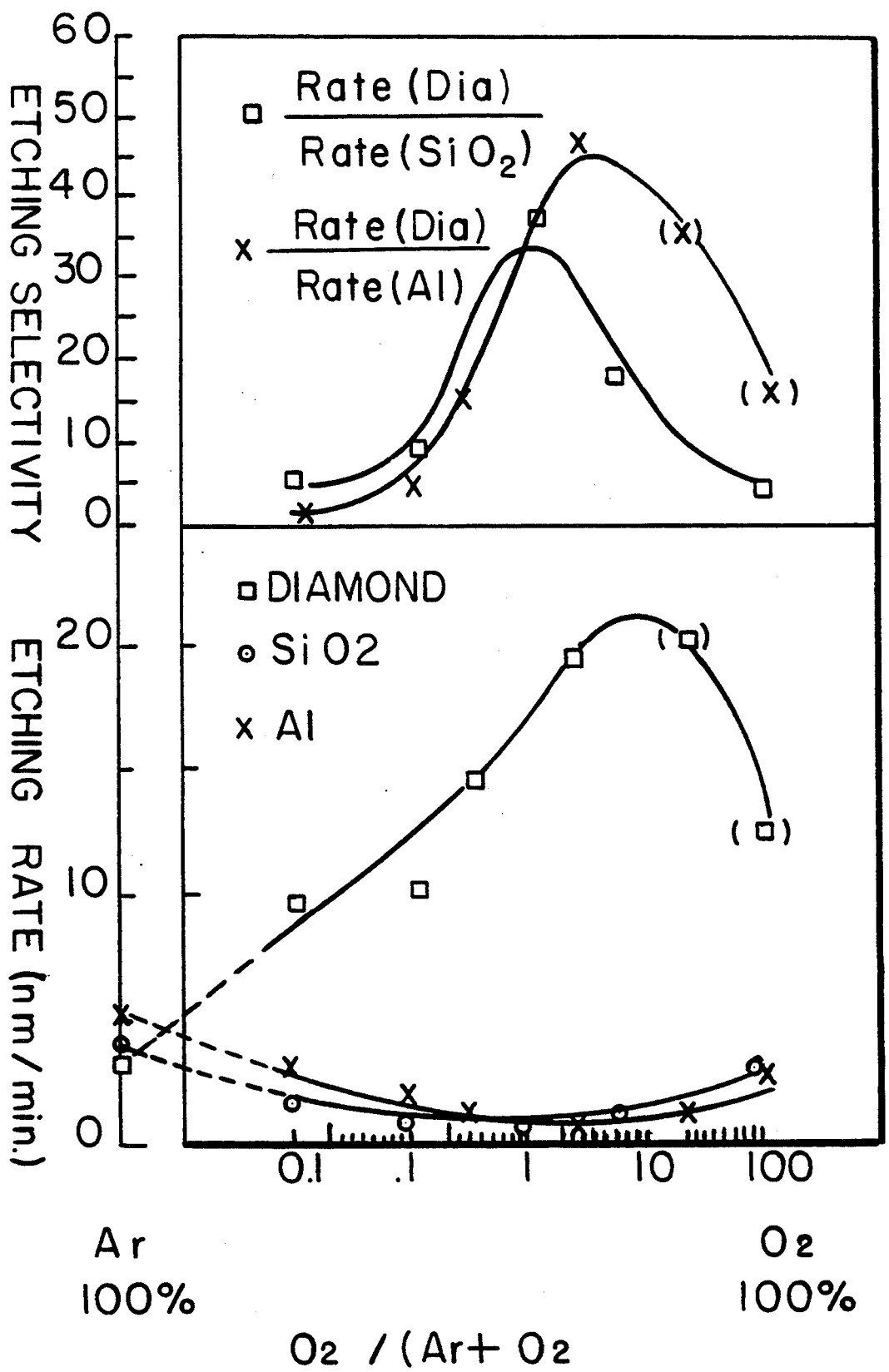
FIG. 2 is a graph showing dependencies of the etching selectivity and the etching rate on the oxygen concentration in the etching gas mixture.

The results are shown in FIG. 2.

When the concentration of oxygen in the mixture of argon and oxygen was from b 0.01 to 50% by volume, the practically acceptable etching selectivity, namely about 5 or larger was achieved.

When aluminum was used as the masking material, in the oxygen concentration range of from 0.1 to 50%, the etching selectivity of about 10 or larger was achieved, and in the oxygen concentration range of from 0.3 to 50%, the etching selectivity of about 20 or larger was achieved.

When SiO$_2$ was used as the masking material, in the oxygen concentration range of from 0.06 to 30%, the etching selectivity of about 10 or larger was achieved, and in the oxygen concentration range of from 0.2 to 6%, the etching selectivity of about 20 or larger was achieved.

When the oxygen concentration was 50% or larger, the etched surface of diamond was uneven, and not suitable for the production of devices. When the oxygen concentration was 20%, the etched surface of diamond was slightly uneven but could be used in the production of devices.

When the oxygen concentration was 5% or less, the good etched surface was obtained. In particular, when the oxygen concentration was 1% or less, the smooth surface having no etch pit was obtained.

The relationship between the oxygen concentration in the mixture and the surface conditions of the etched diamond is summarized in Table 1.

TABLE 1

| RF output (W) | Total pressure (Torr.) | Time (min.) | Oxygen concentration (%) | Surface condition |
|---|---|---|---|---|
| 100 | 0.02 | 30 | 50 | Uneven, R$_{max}$>2000 Å |
| 100 | 0.02 | 30 | 20 | Uneven but usable R$_{max}$<200 Å |
| 100 | 0.02 | 30 | 5 | Smooth, R$_{max}$<20 Å |

TABLE 1-continued

| RF output (W) | Total pressure (Torr.) | Time (min.) | Oxygen concentration (%) | Surface condition |
|---|---|---|---|---|
| 100 | 0.02 | 30 | 1 | Smooth, R$_{max}$<20 Å |
| 100 | 0.02 | 30 | 0.1 | Smooth, R$_{max}$<20 Å |
| 100 | 0.02 | 30 | 0.01 | Smooth, R$_{max}$<20 Å |

EXAMPLE 2

In the same manner as in Example 1 except that the oxygen concentration in the mixture was 1% and several kinds of diamond of different origins were used, the diamond surface masked by the SiO$_2$ film was etched.

The results are shown in Table 2. The same effects were obtained irrespective of the origins of diamond.

TABLE 2

| Diamond | Etching selectivity to SiO$_2$ | Surface condition |
|---|---|---|
| Natural diamond IIa | 35 | Smooth |
| Natural diamond Ia | 40 | Smooth |
| Vapor phase epitaxially grown diamond | 35 | Smooth |
| Vapor phase grown polycrystalline diamond | 37 | Smooth |
| Sintered diamond | 42 | Smooth |

EXAMPLE 3

In the same manner as in Example 1 except that the oxygen concentration was changed in the range between 0.2% and 1%, and RF output and total pressure were changed, the experiments were carried out.

The results are shown in Table 3. The etching selectivity and the surface condition of the etched diamond are greatly influenced by the oxygen concentration in the mixture, but less influenced by the RF output and the total pressure.

When the ECR discharg is used in place of the RF, good results are obtained in the oxygen concentration range between 20% and 50%.

TABLE 3

| RF output (W) | Total pressure (Torr.) | Time (min.) | Oxygen concentration (%) | Etching selectivity to SiO$_2$ | Surface condition |
|---|---|---|---|---|---|
| 100 | 0.1 | 30 | 1 | 50 | Smooth |
| 100 | 0.1 | 30 | 0.2 | 60 | Smooth |
| 100 | 0.08 | 30 | 1 | 45 | Smooth |
| 100 | 0.08 | 30 | 0.5 | 50 | Smooth |
| 100 | 0.04 | 30 | 1 | 40 | Smooth |
| 100 | 0.007 | 30 | 1 | 40 | Smooth |
| 40 | 0.02 | 30 | 1 | 35 | Smooth |
| 200 | 0.02 | 30 | 1 | 35 | Smooth |
| 100 | 0.02 | 30 | 1 | 20 | Smooth |

EXAMPLE 4

In the same manner as in Example 1 except that CO$_2$, CO, N$_2$O or H$_2$O was used in place of the oxygen gas, the masked diamond surface was etched. The etching conditions and the results are shown in Table 4.

When the oxygen concentration was 2%, the particularly preferred results were obtained.

TABLE 4

| RF output (W) | Total pressure (Torr.) | Time (min.) | Gas in Air | Gas concentration (%) | Etching selectivity to SiO$_2$ | Surface condition |
| --- | --- | --- | --- | --- | --- | --- |
| 100 | 0.02 | 30 | CO$_2$ | 0.5 | 20 | Smooth |
| 100 | 0.02 | 30 | CO$_2$ | 1 | 25 | Smooth |
| 100 | 0.02 | 30 | CO$_2$ | 50 | 10 | Uneven |
| 100 | 0.02 | 30 | CO | 2 | 15 | Smooth |
| 100 | 0.02 | 30 | CO | 60 | 20 | Uneven |
| 100 | 0.02 | 30 | N$_2$O | 2 | 40 | Smooth |
| 100 | 0.02 | 30 | N$_2$O | 0.2 | 30 | Smooth |
| 100 | 0.02 | 30 | H$_2$O | 2 | 40 | Smooth |
| 100 | 0.02 | 30 | H$_2$O | 0.2 | 30 | Smooth |

EXAMPLE 5

In the same manner as in Example 1 except that Ar, He, Ne, Kr or Xe was used, the diamond surface masked with the SiO$_2$ film was etched at the RF output of 100 W under the total pressure of 0.02 Torr (2.7 Pa) for 30 minutes, whereby the pattern having the line width of 2 μm was formed.

The results are shown in Table 5. At the oxygen concentration of 1%, the good results were obtained with any of inert gases.

TABLE 5

| RF output (W) | Total pressure (Torr.) | Time (min.) | Inert gas | Oxygen concentration (%) | Etching selectivity to SiO$_2$ | Surface condition |
| --- | --- | --- | --- | --- | --- | --- |
| 100 | 0.02 | 30 | Ar | O$_2$, 1% | 37 | Smooth |
| 100 | 0.02 | 30 | He | O$_2$, 1% | 35 | Smooth |
| 100 | 0.02 | 30 | Ne | O$_2$, 1% | 30 | Smooth |
| 100 | 0.02 | 30 | Kr | O$_2$, 1% | 40 | Smooth |
| 100 | 0.02 | 30 | Xe | O$_2$, 1% | 30 | Smooth |

By the etching method of the present invention, the diamond surface can be etched smoothly at the large selectivity to the masking material, the diamond devices having good characteristics can be freely produced. It is possible to precisely process a diamond material in the production of a surgeon's knife, a needle, a MCM substrate, a heat sink, an electron emitting device, a small gear wheel, a micromachine, and the like.

What is claimed is:

1. A method for etching a diamond surface comprising steps of forming a mask on a surface of diamond, and etching the diamond surface with a mixture of oxygen-containing gas and an inert gas, wherein a concentration of oxygen in terms of O$_2$ is from 0.01 to 20% based on the whole volume of the mixture.

2. The method for etching a diamond surface according to claim 1, wherein said inert gas is argon.

3. The method for etching a diamond surface according to claim 1, wherein said mask is formed from aluminum, and said concentration of oxygen is from 0.1 to 20% based on the whole volume of the mixture.

4. The method for etching a diamond surface according to claim 3, wherein said concentration of oxygen is from 0.3 to 20%.

5. The method for etching a diamond surface according to claim 1, wherein said mask is formed from SiO$_2$, and said concentration of oxygen is from 0.06 to 20% based on the whole volume of the mixture.

6. The method for etching a diamond surface according to claim 5, wherein said concentration of oxygen is from 0.2 to 20%.

* * * * *

UNITED STATES PATENT AND TRADEMARK OFFICE
CERTIFICATE OF CORRECTION

PATENT NO. : 5,344,526
DATED : September 6, 1994
INVENTOR(S) : Nishibayashi et al It is certified that error appears in the above-indentified patent and that said Letters Patent is hereby corrected as shown below:

On title page, add the Foreign Application Priority Data:

—[30] October 16, 1992 [JP] Japan.........4-278548—

Signed and Sealed this

Fourteenth Day of March, 1995

Attest:

BRUCE LEHMAN

Attesting Officer

Commissioner of Patents and Trademarks